United States Patent [19]

Wilkinson

[11] Patent Number: 5,463,699
[45] Date of Patent: Oct. 31, 1995

[54] DATA COMPRESSION

[75] Inventor: James H. Wilkinson, Tadley, United Kingdom

[73] Assignee: Sony United Kingdom Limited, Staines, United Kingdom

[21] Appl. No.: 141,996

[22] Filed: Oct. 28, 1993

[30] Foreign Application Priority Data

Feb. 5, 1993 [GB] United Kingdom ............. 9302281

[51] Int. Cl.$^6$ ............................................. G06K 9/36
[52] U.S. Cl. ........................................... 382/246; 358/427
[58] Field of Search ........................ 382/56; 358/261.1, 358/427, 261.3; 348/395, 398, 403; 375/122

[56] References Cited

U.S. PATENT DOCUMENTS

| | | | |
|---|---|---|---|
| 4,563,671 | 1/1986 | Lim et al. | 382/56 |
| 4,626,829 | 12/1986 | Hauck | 382/56 |
| 4,646,356 | 2/1987 | Anderson et al. | 382/56 |

*Primary Examiner*—Leo H. Boudreau
*Assistant Examiner*—David R. Anderson
*Attorney, Agent, or Firm*—William S. Frommer; Alvin Sinderbrand

[57] ABSTRACT

Data compression apparatus is provided for compressing an input stream of n-bit data samples, possible input sample values being notionally divided into groups each containing a number of sample values equal to a respective power of two. The apparatus comprises: means for generating a code word for at least each non-zero value input sample such that the code words for samples with values in each group have a most significant bit of one type in the same position, which position is different for different groups, and the sequence of bits of lower order than said most significant bit is different in code words for samples with different values in the same group; a run-length counter for generating a run-length count dependent upon the number of samples in a run of zero value input samples terminated by a non-zero value sample; means for generating a position indicator indicating the position of said most significant bit of one type in the code word for the non-zero value sample terminating the run; and means for extracting the sequence of bits of lower order than said most significant bit in that code word.

12 Claims, 8 Drawing Sheets

| Group Code (4 Bits) | Terminating Value |
|---|---|
| 1 | -1, 1 |
| 2 | -3, -2, 2, 3 |
| 3 | -7 ... -4, 4 ... 7 |
| 4 | -15 ... -8, 8 ... 15 |
| 5 | -31 ... -16, 16 ... 31 |
| 6 | -63 ... -32, 32 ... 63 |
| 7 | -127 ... -64, 64 ... 127 |
| 8 | -255 ... -128, 128 ... 255 |
| 9 | -511 ... -256, 256 ... 511 |
| 10 | -1023 ... -512, 512 ... 1023 |
| 11 | -2047 ... -1024, 1024 ... 2047 |

*FIGURE 1*

| VALUE | INPUT SAMPLE | CODE WORD |
|---|---|---|
| 7 | 0111 | 1110 |
| 6 | 0110 | 1100 |
| 5 | 0101 | 1010 |
| 4 | 0100 | 1000 |
| 3 | 0011 | 0110 |
| 2 | 0010 | 0100 |
| 1 | 0001 | 0010 |
| 0 | 0000 | 0001 |
| -1 | 1111 | 0011 |
| -2 | 1110 | 0101 |
| -3 | 1101 | 0111 |
| -4 | 1100 | 1001 |
| -5 | 1011 | 1011 |
| -6 | 1010 | 1101 |
| -7 | 1001 | 1111 |

| POSITION INDICATOR (PI) | RUN LENGTH (RL) | HUFFMAN CODE | BIT SEQUENCE (BS) |
|---|---|---|---|
| – | – | 111111111111110 | – |
| 1 | 1 | 00 | * |
| 2 | 1 | 100 | ** |
| 3 | 1 | 110 | *** |
| 4 | 1 | 1010 | **** |
| 5 | 1 | 1110 | ***** |
| 6 | 1 | 1011 | ****** |
| 7 | 1 | 01111010 | ******* |
| 8 | 1 | 111111111111100 | ******** |
| 9 | 1 | 111111111111101 | ********* |
| 10 | 1 | 111111111111000 | ********** |
| 11 | 1 | 111111111111001 | *********** |

| POSITION INDICATOR (PI) | RUN LENGTH (RL) | HUFFMAN CODE | BIT SEQUENCE (BS) |
|---|---|---|---|
| — | 2 | 1111111111111010 | — |
| 1 | 2 | 0110 | * |
| 2 | 2 | 01010 | ** |
| 3 | 2 | 010000 | *** |
| 4 | 2 | 0100010 | **** |
| 5 | 2 | 1111010 | ***** |
| 6 | 2 | 011111110 | ******* |
| 7 | 2 | 1111111111111011 | ********* |

*FIGURE 8b*

| POSITION INDICATOR (PI) | RUN LENGTH (RL) | HUFFMAN CODE | BIT SEQUENCE (BS) |
|---|---|---|---|
| — | | 1111111111110000 | — |
| 1 | 3 | 01110 | * |
| 2 | 3 | 0111110 | ** |
| 3 | 3 | 11111000 | *** |
| 4 | 3 | 011111100 | **** |
| 5 | 3 | 0101100110 | ***** |
| 6 | 3 | 11110111110 | ****** |
| 7 | 3 | 1111111111110001 | ******* |

FIGURE 8c

DATA COMPRESSION

BACKGROUND OF THE INVENTION

1. Field of the Invention

This invention relates to data compression. The invention is particularly, though not exclusively, applicable in the field of image data compression.

2. Description of the Prior Art

It has been proposed to provide an image data processing system in which image data is decorrelated into sub-band components, quantised and then entropy coded. The quantisation provides some degree of data compression with some loss of information content. The subsequent entropy coding effects a further degree of data compression with no loss of information content.

One known entropy encoding technique is so called run length coding. A typical run length coder looks for sequences of successive zeros within a data stream and assigns a code word to substitute for each sequence of zeros within the data stream. When the data stream is subsequently read, the run-length codes can be expanded to recreate the original data stream.

A variation on this arrangement is the type of entropy encoding proposed in the standard being devised by the Joint Photographic Experts Group (JPEG) and currently under review by the International Standards Organisation. The run-length coding scheme proposed by the JPEG standard operates on an input stream of samples of twelve or more bits resolution. A sequence of successive zero value samples terminated by a non-zero value sample is treated as an "event". Each event is coded according to the number of samples in the run and the value of the terminating sample. Thus, for example, a run of input samples with values 0000004 is assigned a run-length code of 7 and a terminating value of 4. A run of samples with values 00-2 is assigned a run-length code of 3 and a terminating value of –2. A single sample of value 6 in an input stream (i.e. a sample of value 6 not following one or more zero value samples) is assigned a run-length code of 1 and a terminating value of 6.

The possible terminating values are notionally divided into groups for the purpose of the subsequent stage of entropy coding. Each group contains a symmetrical set of positive and negative terminating values, the number of values in each group being equal to a respective power of two. The assignment of terminating values to groups is illustrated in the table of FIG. 1. The first group contains the terminating values –1 and +1. The second group contains the terminating values –3,–2,2,3. The third group contains the values –7,–6,–5,–4,4,5,6,7, and so on. As indicated in the left hand column of the table, each group is identified by a 4-bit group code with a value between 1 and 15 though only the groups with codes 1 to 11 are shown in the table.

Each run-length coded event is assigned a 4-bit group code depending on the terminating value in accordance with the table of FIG. 1. Thus, a run of any length terminated by a value of ±1 will be assigned the group code 1 (i.e. 0001 in binary). A run of any length terminated by a value of ±2 or ±3 will be assigned a group code of 2 (i.e. 0010) and so on. The data is then subjected to Huffman encoding which is a form of commaless encoding whereby events are mapped to a set of codes having the property that no valid code is a prefix of a longer code. The Huffman codes are assigned according to input code popularity, the most common events being mapped to the shortest Huffman codes. A Huffman code is available for each possible combination of run-length code and group code. Thus, a given Huffman code identifies the run-length of the associated event and also the group to which the terminating value is allocated, but not the particular terminating value within that group. The final entropy encoded output for each event is obtained by appending to each Huffman code a "PCM code" consisting of enough additional bits to identify uniquely the particular terminating value within the group for that event. It will be noted from the table of FIG. 1, that, due to the way in which terminating values are allocated to groups, the group code indicates the number of additional bits needed for the PCM code to enable a unique bit sequence to be assigned to each terminating value in the group. For example, the group with code 3 contains eight terminating values, three bits being required to give a unique identification to each of the eight terminating values.

It can be seen that this technique of notionally assigning terminating values to groups substantially reduces the number of Huffman codes required. Events of a given run-length with large terminating values are allocated the same Huffman code, unique identification of the particular event being provided by the subsequent PCM code of length given by the group code. The total number of Huffman codes required is thus greatly reduced as compared with the number of codes that would be required for individual coding of each run-length and terminating value combination.

As indicated above, the JPEG coding scheme operates on samples of twelve or more bits resolution, each sample being processed according to its overall value. This "word-wise" approach can complicate implementation of the scheme and, in particular, makes the scheme difficult to implement in an ASIC (Application Specific Integrated Circuit) design. Further, while the JPEG scheme provides a Huffman code for a maximum run-length of 16 zeros, Huffman codes are otherwise available only for runs terminated by a non-zero value. Thus, the scheme does not provide a means of coding runs of zeros terminated by a zero where the total run length is less than 16. This can cause problems in applications which demand a fixed block structure such that coding of data is performed on blocks of input data samples of a fixed maximum size as is the case in digital video tape recorders (DVTRs). If the data block ends with a run of zero value samples with a run-length of less than 16, then the JPEG scheme does not provide a means of coding this run and so the data block cannot be coded precisely. In addition, the JPEG scheme provides Huffman codes for very unlikely events, such as, for example, a run of 15 zeros terminated by a value of 2047.

SUMMARY OF THE INVENTION

According to one aspect of the present invention there is provided data compression apparatus for compressing an input stream of n-bit data samples, possible input sample values being notionally divided into groups each containing a number of sample values equal to a respective power of two, the apparatus comprising:

means for generating a code word for at least each non-zero value input sample such that the code words for samples with values in each group have a most significant bit of one type in the same position, which position is different for different groups, the sequence of bits of lower order than said most significant bit being different in code words for samples with different values in the same group;

a run-length counter for generating a run-length count dependent upon the number of samples in a run of zero value input samples terminated by a non-zero value sample;

means for generating a position indicator indicating the position of said most significant bit of one type in the code word for the non-zero value sample terminating the run; and means for extracting the sequence of bits of lower order than said most significant bit in that code word.

As indicated above, in the JPEG scheme each sample is treated as a value, 4-bit group codes being assigned according to the overall value of a non-zero terminating sample, and then additional bits are appended to identify uniquely the value of that sample. In contrast, in accordance with the invention, non-zero value input samples are coded in such a manner that the bits of the code words identify in a particularly convenient manner both the group to which each sample belongs and the unique value of the sample within the group. Specifically, the code words are generated such that the position of the most significant bit of one type, for example the position of the most significant "1", identifies the group, and the bits of lower order than this most significant bit uniquely identify the value within that group. Since the bits of each code word identify both the group and unique value in such a convenient way, implementation of the data compression system can be substantially simplified as compared with the JPEG technique. For example, each code word is preferably generated by bit-level coding of the corresponding input sample, i.e. by operating on the individual bits of the input sample in producing the code word. This "bit-wise" approach enables the apparatus to be implemented more easily in an ASIC design than the "word-wise" system of the JPEG technique.

In a convenient arrangement, the apparatus comprises a precoder for receiving the input samples and generating the said code words, and a run-length coder, connected to receive the code words from the precoder, for generating the run-length count and the position indicator and extracting the said sequence of bits. In this arrangement therefore, code words are generated from the input samples in a precoding stage, the run-length count, position indicator and sequence of bits then being generated from the code words by the run-length coder.

It is preferred that, as in the JPEG scheme, each group of input sample values contains a symmetrical set of positive and negative sample values. Also as in the JPEG scheme, it is further preferred that the number of values in each group is $2^x$ where x for any group is the number of bits required to represent all positive sample values in that group. Thus, for example, a group containing two values, i.e. $2^1$ values, contains the values +1 and −1. A group containing four values, i.e. $2^2$ values, contains the values −3, −2, +2, +3. A group containing eight values, i.e. $2^3$ values, contains the values −7 . . . −4, +4 . . . +7, and so on. In this case, the position of the said most significant bit of one type in code words corresponding to any said group can conveniently be the position representing $2^x$ for that group. Thus, for example, in a group containing the values ±2, ±3, there are $4=2^2$ values, so that x=2 and the position of the said most significant bit is that representing $2^2$, i.e. two powers higher than the least significant bit position (representing $2^0$). The two bits of lower order than this most significant bit have a unique value for each of the four code words in the group.

Although code words need only be generated for non-zero value input samples, it is preferred that the means for generating code words is arranged to generate a code word having a most significant bit of one type in the least significant bit position for a zero value input sample. Code words are then generated for both zero and non-zero value samples, the code words for zero value samples being unique in having the said most significant bit of one type in the least significant bit position.

The apparatus may include a commaless coder, connected to receive the run-length count and position indicator, for generating a commaless code representative of the run-length count and position indicator. The commaless code, together with the said sequence of bits extracted from the code word for the sample terminating a run, then uniquely identify the sample values of the run.

In contrast to the JPEG scheme described above, it is preferred that the commaless coder can generate commaless codes for runs of zero value samples of run-length 1 to a maximum run-length $L_{max}$. This has two main advantages. Firstly, it allows the apparatus to be used in applications, such as in DVTRs, which demand a fixed block structure as described above. The run-length counter can be arranged to generate a run-length count dependent upon the number of samples input since the last non-zero value sample in response to an end-of-block signal indicating the end of a block of input samples. Thus, even when a block of input samples ends in a run of zero value samples, a commaless code can be generated for this run, and the block can be coded precisely.

The second advantage of this feature is that it allows for simplification of look-up tables in the commaless coder as compared with the JPEG system. As mentioned earlier, the JPEG scheme provides Huffman codes for very unlikely events, such as a run of 15 zeros terminated by a value of 2047. As a consequence, the number of Huffman codes required by the JPEG specification is very large. In preferred embodiments of the present invention, the commaless coder can generate commaless codes for single samples with values from $-(2^n-1)$ to $+2^n-1$ inclusive, and for runs of zero value samples terminated by a non-zero value sample having a value in the range $-V_{max}$ to $+V_{max}$ where $V_{max}$ is in a group containing lower positive sample values than the group containing the value $2^n-1$, the commaless coder being arranged such that, on reception of a run-length count and position indicator representing a run of zero value samples terminated by a non-zero value sample with a value outside the range $-V_{max}$ to $+V_{max}$, the commaless coder generates a commaless code for the run of zero value samples preceding the non-zero value sample and a separate commaless code for the non-zero value sample as a single sample. Here, commaless codes are not available for runs of zeros terminated by a sample with a value either less than $-V_{max}$ or greater than $+V_{max}$. These represent unlikely events since, in practice, the probability of an event decreases as the value of the terminating sample increases or decreases from zero. If the commaless coder receives an input indicating that such an unlikely event, for which a commaless code is not available, has occurred, then the commaless coder generates two commaless codes, one for the run of zero value samples preceding the non-zero value terminating sample, and another for the non-zero value sample on its own. The effect of this is to allow unlikely events to be catered for while significantly reducing the number of commaless codes that need to be stored in a look-up table.

In accordance with another aspect of the invention there is provided a method of compressing an input stream of n-bit data samples, possible input sample values being notionally divided into groups each containing a number of sample values equal to a respective power of two, the method comprising:

generating a code-word for at least each non-zero value input sample such that the code words for samples with values in each group have a most significant bit of one type in the same position, which position is different for different groups, the sequence of bits of lower order than said most significant bit being different in code words for samples with different values in the same group; generating a run-length count dependent upon the number of samples in a run of zero value input samples terminated by a non-zero value sample;

generating a position indicator indicating the position of said most significant bit of one type in the code word for the non-zero value sample terminating the run; and extracting from the code word for the non-zero value sample terminating the run the sequence of bits of lower order than said most significant bit of one type.

It is to be appreciated that, in general, where features are described herein with reference to an apparatus in accordance with the invention, corresponding features may be provided in accordance with a method of the invention and vice versa.

BRIEF DESCRIPTION OF THE DRAWINGS

The above and other objects, features and advantages of the invention will be apparent from the following detailed description of illustrative embodiments which is to be read in conjunction with the accompanying drawings, in which:

FIG. 1 illustrates the allocation of sample values to groups in the JPEG entropy encoding scheme;

FIG. 6 is a table showing code words generated from input samples in the entropy coder of FIG. 4;

FIGS. 8a, 8b and 8c are tables illustrating the allocation of Huffman codes to runs of input samples.

DESCRIPTION OF THE PREFERRED EMBODIMENTS

Figure 2:
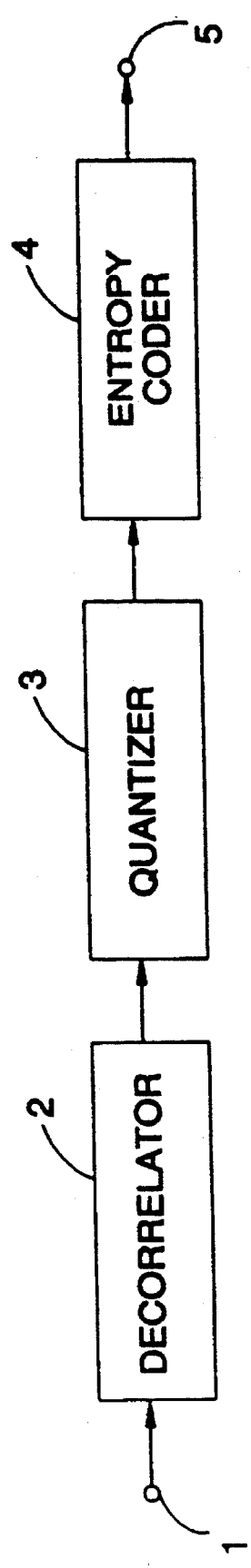
FIG. 2 is a schematic block diagram of a data compression system.

FIG. 2 is a schematic block diagram giving an overview of data compression apparatus for effecting intra-image frequency separation and compression of a video signal in the two-dimensional spatial frequency domain. A digital video signal comprising successive multi-bit, for example 8-bit, samples or words, each representing a pixel of a scanned image, is applied via an input 1 to a decorrelator 2. A frequency-separated video signal is fed by the decorrelator 2 via a quantizer 3 to an entropy coder 4 which supplies a compressed signal to an output 5. The compressed signal can be transmitted or stored as required by the particular application.

The details of the operation of the decorrelator 2 and the quantizer 3 are not of direct relevance to the embodiment of the invention to be described which relates specifically to the entropy coder 4. The decorrelator 2 and quantizer 3 are therefore described only briefly below.

In the decorrelator 2, various decorrelation techniques could be used. One suitable form of decorrelation would be so-called transform coding, in particular using the discrete cosine transform. Use of the discrete cosine transform for decorrelation is prescribed in a version of a compression system described in the JPEG standard. According to this transform technique, the signal is subjected to a linear transform (decorrelation) operation prior to quantization and entropy encoding. An alternate approach is to use a decorrelation technique based on sub-band coding. In this case, the decorrelator 2 comprises a spatial (two-dimensional) sub-band filtering arrangement which divides the input video signal into a plurality of uncorrelated sub-bands each containing the spatial frequency of the content of the image in a respective one of a plurality of areas of a two-dimensional frequency plane of the image. Each field of the input video signal is subjected to a multi-stage filtering operation in the direction of both the horizontal and vertical axes of the image, with the result that the field is divided into 64 sub-bands which contain different spatial (i.e. horizontal and vertical) frequency components of the frequency content of the image. Samples of the decorrelated field are then supplied by the decorrelator 2 to the quantizer 3. The quantizer 3 operates to reduce the number of levels to which the data samples received from the decorrelator can be assigned, and to increase the probability of runs of zero value samples in the data supplied to the entropy encoder. The way in which the quantizer operates is that an overall value is assigned to the image to be coded. For samples in each sub-band of the decorrelated image output by the decorrelator 2, the overall value is divided by a corresponding matrix value to give a scaling value for all samples in that sub-band. All operations are integer with rounding used in the divide operations. The lowest matrix values, and hence the highest scaling values, correspond to sub-bands of the decorrelated image to which the human psycho-visual system is most responsive. The highest matrix values, and hence the lowest scaling values, correspond to sub-bands to which the human psycho-visual system is least responsive. Thus, the quantization process involves deliberate discarding of some frequency data considered to be redundant or of little importance to adequate perception of the image. The quantized samples are output by the quantizer 3 to the entropy coder 4 as a 12-bit wide stream of two's complement encoded samples. The entropy coder, an embodiment of which will be described in detail with reference to FIG. 4, serves to compress the input sample stream and supplies the compressed data to the output 5.

Figure 3:
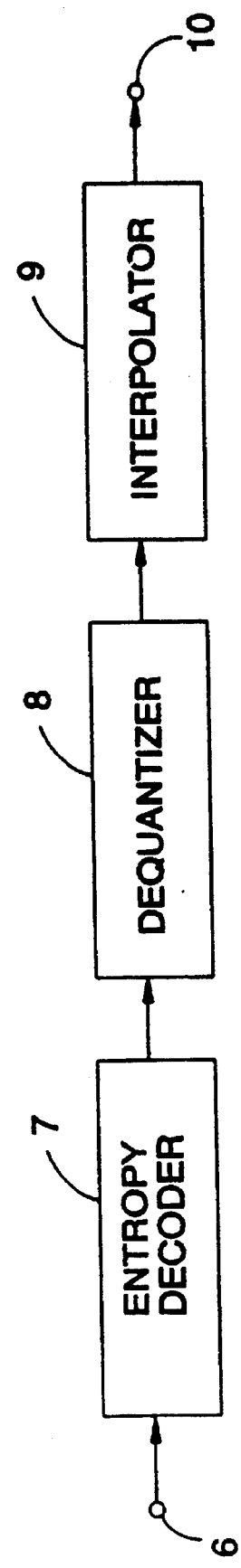
FIG. 3 is a schematic block diagram of a complementary data decompression system.

FIG. 3 is a schematic block diagram giving an overview of data decompression apparatus for decompressing data compressed by the system of FIG. 2. The compressed data can be restored substantially to its original form by entropy decoding, dequantizing and interpolation operations. The compressed signal is supplied via an input 6 to an entropy decoder 7 and is then passed via a dequantizer 8 to an interpolator 9 which supplies the restored video signal to an output 10. The steps of entropy decoding, dequantizing and interpolation employ parameters converse to those used for decorrelation, quantizing and entropy coding respectively during compression.

Figures 4, 5:
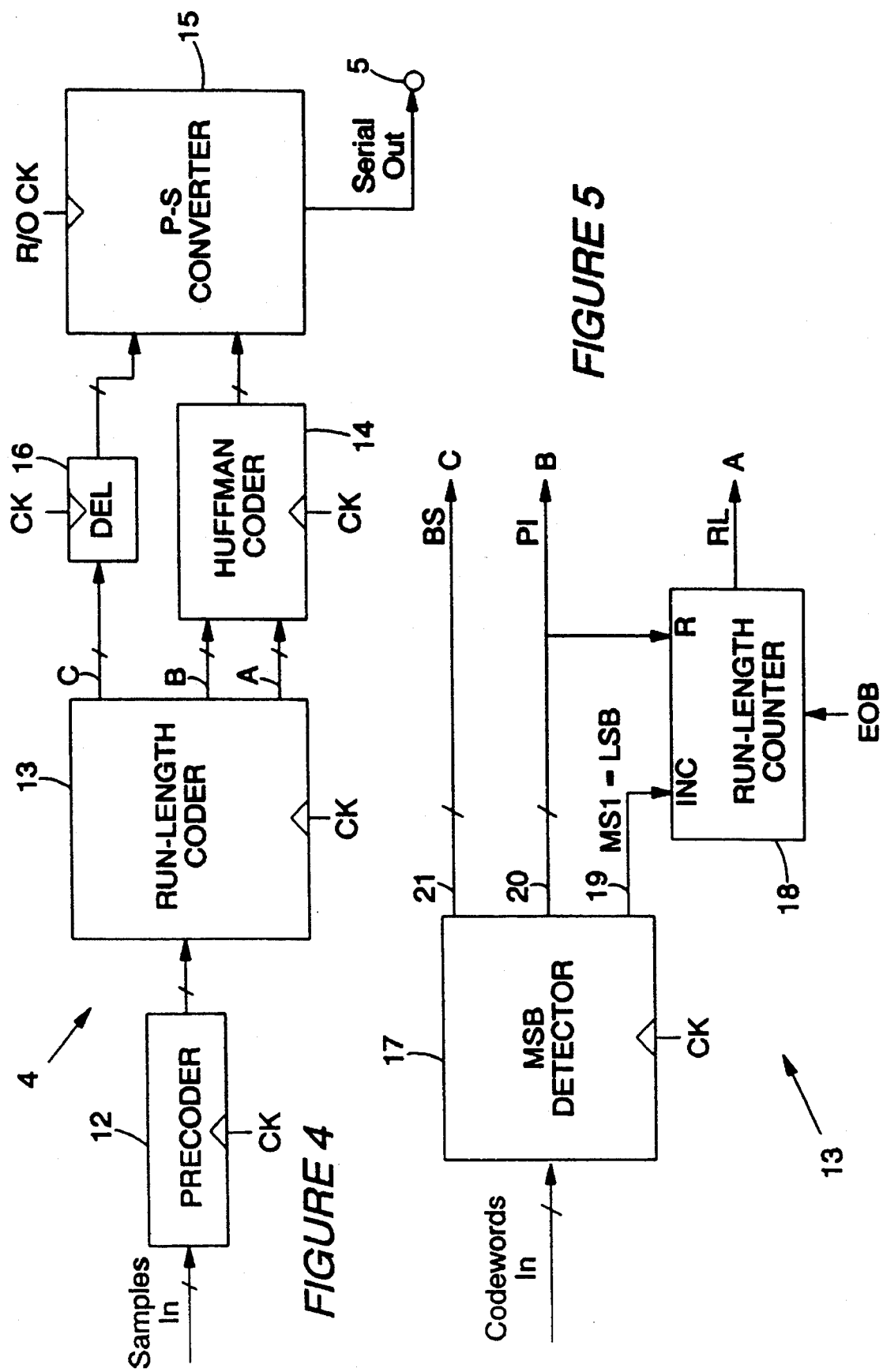
FIG. 4 is a schematic block diagram of an entropy coder embodying the invention.
FIG. 5 is a schematic block diagram showing part of the entropy coder of FIG. 4 in more detail.

FIG. 4 illustrates data compression apparatus embodying the invention in the form of an entropy coder 4 suitable for use in the system described above with reference to FIG. 2. The entropy coder 4 comprises a precoder 12 the output of which is connected to a run-length coder 13 having outputs A, B and C. The outputs A and B are connected to a Huffman coder 14 which provides an output to a parallel-to-serial (p-s) converter 15. The output C of the run-length coder 13 is connected via a delay (DEL) 16 to the p-s converter 15. The p-s converter 15 supplies the compressed data as a serial bit stream to the output 5 of the entropy coder.

FIG. 5 shows the run-length coder 13 of FIG. 4 in more detail. As illustrated, the run-length coder 13 comprises a most significant bit (MSB) detector 17 and a run-length counter 18. The MSB detector 17 has three outputs 19, 20 and 21. The output 19 is connected to an increment input (INC) of the run-length counter 18. The output 20 of the MSB detector 17 is connected to a reset input (R) of the run-length counter 18 and also forms the output B of the run-length coder 13. The output 21 of the MSB detector 17 forms the output C of the run-length coder 13. The output A of the run-length coder 13 is provided by the output of the run-length counter 18 as shown. The operation of the entropy coder 4 is as follows.

In operation, the precoder 12 receives the stream of 12-bit conventional two's complement encoded samples from the quantizer 3 (FIG. 2). The precoder 12 codes each incoming 12-bit sample at the bit level using the following algorithm (where "S" is an incoming sample):

*IF S <0 THEN S=(S XOR 4095)\*2+3 ELSE IF S=0 THEN S=1 ELSE S=S\*2*

The effect of this is to perform a left shift on the bits of positive value samples, and to take the one's complement, perform a left shift and add 3 to negative value samples. The sign bit in the two's complement input samples is therefore transferred to the least significant bit position. The resulting code words for input samples with values between −7 and +7 are shown in the table of FIG. 6.

In FIG. 6, the left hand column indicates the value of the input sample, the input samples and the corresponding code words being given in the central and right hand columns respectively. In the table, the most significant eight bits (which are all zero) have been omitted from the input samples and code words for clarity.

The 12-bit two's-complement input samples can have values from −2048 to +2047. All possible input samples can be coded using the algorithm given above but an input sample of value −2048 would have been assigned the code word 000 . . . 000. This code word is not used, the sample of value −2048 in fact being coded as −2047. Since 1 is added to zero input value samples, the result is then that the precoding process ensures a "1" appears somewhere in the bit sequence of all code words.

It will be seen from the table of FIG. 6 that the code words for input samples with values +1 each have a most significant "1" in the position representing $2^1$. The code words for input samples with values −3,−2,2,3 each have a most significant "1" in the position representing $2^2$. The code words for input samples with values −7 . . . −4, 4 . . . 7 each have a most significant "1" in the position representing $2^3$. Similarly, code words for samples with values −15 . . . −8,8 . . . 15 will have a most significant "1" in the position representing $2^4$, code words for samples with values −31 . . . −16,16 . . . 31 will have a most significant "1" in the position representing $2^5$, and so on. Thus, if the input sample values are considered to be notionally divided into groups as previously described with reference to FIG. 1, it can be seen that the precoding process generates code words such that the position of the most significant "1" in each code word identifies the group to which the value of the corresponding input sample belongs, the position of the most significant "1" being the position representing $2^x$ where x is the number of bits required to represent all positive sample values in the group. It will also be seen from the table that, for code words for samples with values in any given group, the sequence of bits of lower order than the most significant "1" is different for different values in that group. Thus, the bits of lower order than the most significant "1" in any code word uniquely identify the value of the corresponding input sample within the group. The precoder 12 can be implemented in a simple manner either using a PROM or by means of simple gate logic. The generation of code words as described above allows the subsequent run-length coding to be performed in a simple manner as will now be described.

The 12-bit code words generated in the precoder 12 are clocked out of the precoder by the system clock (CK) to the MSB detector 17 of the run-length coder 13. The MSB detector 17 detects the position of the most significant "1" in each input code word and, on the next system clock pulse (CK), generates an output on one or mope of its outputs 19, 20 and 21 in dependence upon the detected position. If the most significant "1" is in the least significant bit (LSB) position in a code word, then the code word corresponds to a zero value input sample and the MSB detector 17 generates a pulse on its output 19. This pulse is supplied to the increment input INC of the Pun-length counter 18 setting the run-length count to 1. If the most significant "1" in the next input code word is again in the LSB position, indicating another zero input value sample, then, again, the MSB detector 17 generates a pulse on its output 19 to increment the run-length counter 18 so that the run-length count equals 2. This process is repeated as successive code words representing a run of zero input value samples are supplied to the MSB detector 17, the run-length count being incremented once for each sample in the run.

The above process continues until a code word representing a nonzero value input sample is supplied to the MSB detector 17. The MSB detector detects the position of the most significant "1" in this code word and generates a position indicator (PI) indicating the position of this bit within the code word. Since the code words are twelve bits in length, four bits are required for the position indicator PI. On the next clock pulse CK, the MSB detector supplies the position indicator PI to its output 20 and at the same time outputs the sequence of bits (BS) of lower order than the most significant "1" in the code word on its output 21.

The output 20 of the MSB detector 17 is connected to the reset input R of the run-length counter 18. The counter is configured such that, when an input is received at its reset input R, the current run-length count incremented by 1 is supplied to its output which forms the output A of the run-length coder 13. The output run-length count RL is therefore the number of input samples in the run of zero input value samples terminated by the non-zero value sample.

Thus, on detection of the code word for a non-zero value sample, the run-length count RL is supplied to the output A of the run-length coder, the position indicator PI giving the position of the most significant "1" in the code word for the terminating sample is supplied to the output B of the run-length coder, and the bit sequence BS of lower order than the most significant "1" is supplied to the output C of the run-length coder. The way in which RL, PI and BS are used to generate the final compressed output will be described further below.

The run-length count RL does not increase indefinitely as successive code words for a run of zero value samples are supplied to the detector 17. The run-length counter is designed so that, if the run-length count RL reaches a maximum value $L_{max}$, corresponding to a run of zero value input samples of length $L_{max}$, then the counter 18 outputs the maximum run-length count and then resets to zero. The next input sample is then treated as the first sample in a new run, the run-length counter 18 being incremented as previously described. Accordingly, very long runs of zero value samples terminated by a non-zero value sample will be coded as one or more runs of zero value samples of length $L_{max}$, plus a run terminating in a non-zero value sample. An appropriate value for $L_{max}$ may vary depending upon the particular application, but in the present example $L_{max}$ is set at 16.

The run-length counter 18 is also responsive to an end-of-block (EOB) indicator which indicates the end of a block containing a predetermined number of input samples. In response to the EOB indicator, the run-length counter 18 is triggered to output the current run-length count RL and then reset the count to zero ready for the next input sample. The EOB indicator may, for example, be derived from the system clock signal CK, the E0B signal being generated once for every M clock pulses where M represents the number of samples in a block and may vary depending upon the application. The purpose of the EOB indicator is to allow use of the run-length coder 13 in DVTRs, for example, where coding must be performed on blocks of input samples of a fixed maximum size, i.e. M samples. Output of a run-length count at the end of each block of input samples ensures that each block is coded precisely.

Figure 7:
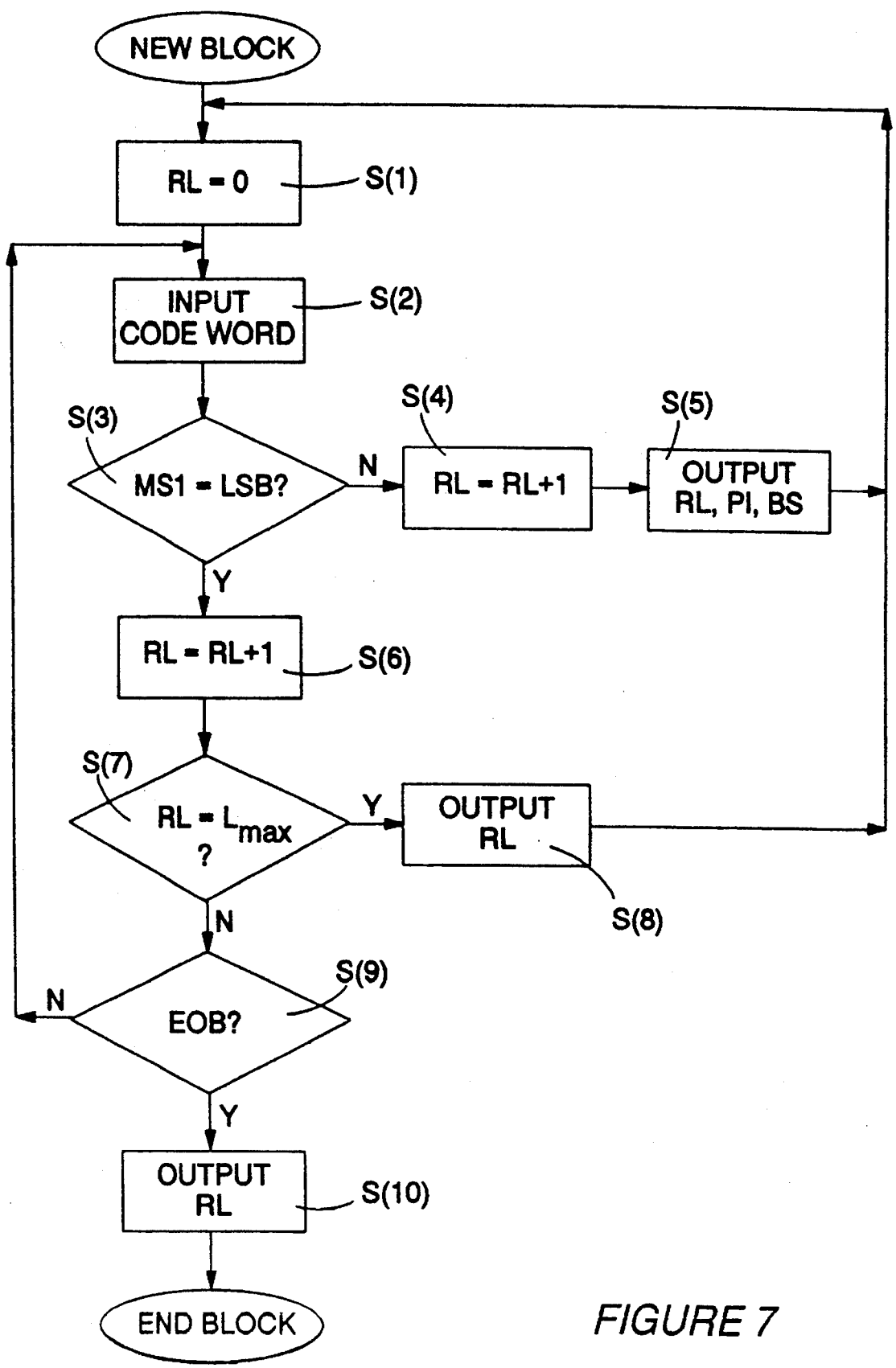
FIG. 7 is a schematic flow diagram illustrating the operation of part of the entropy encoder of FIG. 4.

FIG. 7 is a flow diagram of the logical operations performed by the run-length coder 13 shown in FIG. 5. At the beginning of a new block of input samples, the run-length count RL is set to zero in step S(1). The code word for a sample is input to the MSB detector 17 in step S(2). If the most significant "1" is not in the LSB position (step S(3)), indicating a non-zero value sample, then the run-length count is incremented in step S(4) and the run-length count RL, position indicator PI and bit sequence BS are output in step S(5). The operation then returns to step S(1) in which RL is set to zero ready for the next input sample.

If in step S(3) the most significant "1" is in the LSB position, indicating a zero value sample, then the Pun-length count is incremented in step S(6), and in step S(7) the run-length count is tested to see whether the count equals $L_{max}$ corresponding to a maximum length run of zero value input samples. If RL=$L_{max}$, then RL is output in step S(8) and the process returns to step S(1) where RL is set to zero ready for the next input sample. If RL is less than $L_{max}$ in step S(7), then the process proceeds to step S(9) which checks for an end-of-block indicator EOB. If the end of a block is not indicated then the step returns to step S(2) where the next code word is input. If the end of a block is indicated in step S(9), then the run-length count RL is output in step S(10), terminating the block of samples. The process may then return to step S(1) for a new block of input samples.

Appropriate control logic for implementing the functions of the MSB detector 17 and run-length counter 18 described above will be apparent to those skilled in the art.

Referring again to FIG. 4, the outputs A and B of the run-length coder 13 are connected to the Huffman coder 14. Thus, for each input run, the run-length RL and position indicator PI (where present) are supplied to the Huffman coder 14. The input RL, PI is used by the Huffman coder to address one or mope look-up tables defining Huffman codes. One or more Huffman codes representing the input RL, PI are then output by the Huffman coder 14 to the p-s converter 15. The operation of the Huffman coder 14 will now be described with reference to the tables of FIGS. 8a to 8c.

The Huffman coder 14 can generate Huffman codes for any possible input RL, PI. Of course, PI will be present only where the input represents a run terminated by a non-zero value sample. In these cases, RL can have any value between one and $L_{max}$, where $L_{max}$ here is 16. PI will not be present where the input represents a run of zero value samples only. Here, the maximum possible value of RL is again 16, but RL can also have any value from 1 up to 16 since the input may represent a run terminating a block of input samples. The table of FIG. 8a illustrates, by way of example, the Huffman codes generated for all possible inputs where RL equals 1, i.e. for a single input sample. The left hand column of the table indicates the possible values of the position indicator PI, the first entry in this column indicating the absence of a position indicator, i.e. the code represents a single zero value sample. As previously described, possible input sample values are notionally divided into groups in accordance with the table of FIG. 1. For 12-bit input samples, code words for sample values in the range −2047 to +2047 can be coded in the precoder so that there ape eleven groups in this example (see FIG. 1). The value of the position indicator PI gives the position of the most significant 1 in code words for input samples which in turn identifies the group containing the corresponding sample values. Thus, PI can have any value from 1 to 11 as indicated in the left hand column of the table. A position indicator of 1 represents a single input sample with a value of ±1. A position indicator of 2 represents a single input sample with a value of −3,−2,2 of 3. A position indicator of 3 represents a single input sample with a value −7 . . . −4,4 . . . 7, and so on. It will be noted that the Huffman codes are different for each entry in the table. Thus, the Huffman codes for run-lengths of 1 uniquely identify either the group containing the value of the input sample or that the input sample is a zero value sample.

FIG. 8b shows a table similar to that of FIG. 8a for the case where RL equals 2, i.e. for a run consisting of two samples, and FIG. 8c is a similar table for the case where RL equals 3, i.e. for a run of three samples. In each case, a Huffman code is provided for a run of only zero value samples, and top runs terminated by samples with values in different groups. Similar tables ape provided for run-length values RL=4,5 . . . 16, the Huffman codes all being unique and so uniquely identifying both the run-length and either the group to which the terminating sample value belongs or that the run is of zero value samples only.

It will be noted that the tables for runs of length 2 of 3 only provide Huffman codes for values of the position indicator PI from 1 to 7. Thus, for example, for an input to the Huffman coder 14 of RL=2 and PI=8, a single Huffman code is not available. The tables (not shown) for run-lengths RL=4 to 16 are similar in that Huffman codes are not provided for values of PI greater than 7. This is because it has been found in practice that runs of zero value samples terminated by samples with values of less than −127 or greater than +127 are extremely rare. Samples of value ±127 correspond to a position indicator PI of value 7. If the Huffman coder 14 receives an input for which a single Huffman code is not provided, then the input is treated as a run of zero value samples of length RL-1 and a single non-zero value sample. Since Huffman codes are available for all possible runs of zero value samples, and also for single samples with values in all possible groups, a Huffman code for the run of zero samples of length RL-1, and a further Huffman code for the single non-zero value sample, is always available. The Huffman coder 14 therefore generates two Huffman codes in these cases, allowing coding of all possible inputs RL, PI while substantially reducing the number of individual Huffman codes required. In the present example, using the above scheme only 132 Huffman codes are required which is significantly less than in the JPEG scheme described earlier. Suitable control logic for controlling addressing of the look-up tables in the Huffman coder 14 in dependence upon the inputs RL and PI as described above will be apparent to those skilled in the art.

It will be seen from the above that the codes generated by the Huffman coder 14 uniquely identify both the run-length and, either the group containing the non-zero value of the terminating sample, or that the run is of zero values only. However, to identify the particular value of a terminating sample within a group, further bits need to be appended to the Huffman code. These bits are provided by the bit sequence BS output by the MSB detector 17.

Referring again to FIG. 4, as RL and PI are supplied to the Huffman coder 14, the bit sequence BS is supplied on the output C of the run-length coder 13 to the p-s converter 13 via a delay 16 which compensates for the delay introduced in the Huffman coder 14. As the bit sequence BS uniquely identifies the particular value within a given group of an input sample, the bit sequence BS is appended to the corresponding Huffman code (or codes) in the p-s converter 15 so that the resulting code uniquely identifies the input run. In the tables of FIGS. 8a to 8c, the right hand column indicates the number of bits in the bit sequence BS for each value of the position indicator PI. The resulting code is then clocked out of the p-s converter 15 as a serial bit stream by a read-out clock R/O CK.

Since the number of bits supplied to the p-s converter 15 will vary for different input runs, the read-out clock R/O CK operates at p times the rate of the system clock, where p corresponds to the maximum possible number of bits supplied to the converter 15 at one time which in turn depends on the lengths of the Huffman codes and the maximum length of the bit sequence BS. The p-s converter 16 contains a first register of length equal to the maximum possible number of bits received from the Huffman coder 14, and a second register of length equal to the maximum length of BS. Means are provided to mark the position in the first register of the last bit of an input from the Huffman coder 14. The bits are then read out of the first register up to the position of the marker, followed directly by the bits of BS from the second register. The p-s converter 15 thus outputs the input Huffman code (or codes) followed by the bits of the bit sequence BS, as a serial bit stream at the rate of R/O CK.

It will be seen that the embodiment described above provides a simplified entropy encoding system which can easily be implemented in an ASIC design with a consequent improvement in efficiency.

It will be apparent to those skilled in the art that the algorithm implemented by the precoder 12 can be modified for input samples of more than 12 bits in length. Also, $L_{max}$, the maximum length of a run of zero value samples as set in the run-length coder 13, could be greater than 16, the Huffman code tables being extended accordingly. Further, while the precoder has been described as generating code words with a most significant "1" in the least significant position for zero value samples, zero value samples could be transmitted without coding to the run-length coder 13 and identified by the lack of a "1" anywhere in the code word.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined in the appended claims.

I claim:

1. Apparatus for reducing the quantity of data needed to represent an input stream of data sample signals, each of said signals representing video image data, possible input sample values being notionally divided into groups each containing a number of sample values equal to a respective power of two, the apparatus comprising:

means for generating a code word for at least each non-zero value input sample signal such that the code words for sample signals with values in each group have a most significant bit signal of one type in the same position, which position is different for different groups, the sequence of bit signals of lower order than said most significant bit signal being different in code words for sample signals with different values in the same group;

a run-length counter for generating a run-length count dependent upon the number of sample signals in a run of zero value input sample signals terminated by a non-zero value sample signal;

means for generating a position indicator signal indicating the position of said most significant bit signal of one type in the code word for the non- zero value sample signal terminating the run; and means for extracting the sequence of bit signals of lower order than said most significant bit signal in that code word.

2. Apparatus as claimed in claim 1, wherein the means for generating code words generates each code word by bit-level coding of the corresponding input sample signal.

3. Apparatus as claimed in claim 1, comprising a precoder for receiving the input sample signals and generating the said code words, and a run-length coder, connected to receive the code words from the precoder, for generating the run-length count and the position indicator signal and extracting the said sequence of bit signals.

4. Apparatus as claimed in claim 1, wherein each group of input sample signal values contains a symmetrical set of positive and negative sample signal values.

5. Apparatus as claimed in claim 4, wherein the number of values in each group is $2^x$ where x for any group is the number of bit signals required to represent all positive sample signal values in that group.

6. Apparatus as claimed in claim 5, wherein the position of the said most significant bit signal of one type in code words corresponding to any said group is the position representing $2^x$ for that group.

7. Apparatus as claimed in claim 1, wherein the means for generating code words is arranged to generate a code word having a said most significant bit signal of one type in the least significant bit position for a zero value input sample.

8. Apparatus as claimed in claim 1, including a comma-less coder, connected to receive the run-length count and the position indicator, for generating a commaless code representative of the run-length count and position indicator.

9. Apparatus as claimed in claim 8, wherein the commaless coder can generate commaless codes for runs of zero value samples of run-length 1 to a maximum run-length $L_{max}$.

10. Apparatus as claimed in claim 9, wherein the run-length counter is arranged to generate a run-length count dependent upon the number of sample signals input since the last non-zero value sample in response to an end-of-block signal indicating the end of a block of input sample signals.

11. Apparatus as claimed in claim 9, wherein the commaless coder can generate commaless codes for single sample signals with values from $-(2^n-1)$ to $+2^n-1$ inclusive, and for runs of zero value sample signals terminated by a non-zero value sample signal having a value in the range $-V_{max}$ to $+V_{max}$ where $V_{max}$ is in a group containing lower positive sample signal values than the group containing the value $2^n-1$, the commaless coder being arranged such that, on reception of a run-length count and position indicator signal representing a run of zero value sample signals terminated by a non-zero value sample signal with a value outside the range $-V_{max}$ to $+V_{max}$, the commaless coder generates a commaless code for the run of zero value sample signal preceding the non-zero value sample signals and a separate commaless code for the non-zero value sample signal as a single sample signal.

12. Apparatus as claimed in claim 8, wherein the commaless coder includes a Huffman look-up table.

* * * * *